United States Patent Office 3,219,497

Patented Nov. 23, 1965

3,219,497

PROCESS OF FABRICATING P-N JUNCTIONS FOR TUNNEL DIODES

Paul E. V. Shannon, Kerby Hills, Md., assignor to the United States of America as represented by the Secretary of the Navy No Drawing. Filed Nov. 29, 1962, Ser. No. 241,077
1 Claim. (Cl. 148—184)
(Granted under Title 35, U.S. Code (1952), sec. 266)

The invention described herein may be manufactured and used by or for the Government of the United States of America for governmental purposes without the payment of any royalties thereon or therefor.

This invention relates to the fabrication of p-n junctions, and more particularly to the process of forming fused-junctions which are suitable for tunnel diodes.

In the prior art, semiconductor diodes were fabricated by forming p-n junctions in monatomic semiconductors, such as germanium or silicon, by converting a part of an n-type germanium or silicon crystal to the opposite p-type. The transition was made by alloying a small amount of a low-melting acceptor material, such as indium, into the surface of an n-type crystal specimen, for example, a germanium wafer containing a donor material, such as arsenic.

This method of forming p-n junctions has been employed more recently in diodes which exhibit quantum mechanical tunneling with negative resistance regions. The transition from n-type to p-type is abrupt; total thickness of the transition region being in the order of 100–200 Angstroms. A typical D.C. characteristic of such a diode built in germanium has a high reverse current, higher than the regular forward current, and a rapid increase in forward current at a very small forward voltage, followed by a drop, producing a region of differential negative resistance, while at higher voltages the current increases again and the characteristic becomes identical with that of an ordinary p-n junction diode.

Previous techniques for forming p-n junctions of desired specification were cumbersome and time-consuming involving a considerable degree of uncertainty in the fusion and alloying of low-melting metals on semiconductive wafers. The fusion step was obtained by heating the wafer and metal pellet or dot to a temperature as high as 900° C. for periods of a few seconds. During the fusion, the atmosphere within the fusion chamber was an inert gas, for example helium, to prevent oxidation of the alloying surfaces. It was necessary for the operator to retain the metal pellet in contact with the crystal wafer during the rapid fusion cycle. The metal pellet often failed to adhere sufficiently to the crystal or became loosened upon reaching the molten state and rolled off the surface. Often the metal failed to reach the desired penetration over a sufficient surface area, as required for high current tunnel diodes.

In carrying out the alloying process, it was previously necessary to provide considerable surface preparation along with special atmospheres. Pretreatment of the semiconductive wafers involved etching operations, initially in a strong etching solution containing, for example, concentrated nitric acid and hydrofluoric acid to impart a uniform crystal surface. In addition, surface etching was employed immediately preceding the alloying operation in order to remove surface oxides, followed by water washes to remove water-soluble residues remaining on the surfaces. It was further required to maintain the surface condition in a high degree of cleanliness during the alloying step to prevent surface oxidation.

The present invention overcomes the above and other difficulties and provides an improved technique for forming abrupt, relatively narrow p-n junctions in the order of about 100 to 200 Angstroms; moreover, the present technique is rapid, reliable and easily reproducible.

An object of the present invention is to provide an improved technique in forming p-n junctions in diodes.

According to the basic concept of the present invention, the method for producing p-n junctions with desirable tunnel diode characteristics involves the use of highly-doped n or p type germanium, silicon, gallium arsenide, gallium antimonide, etc. in the form of wafers to which a tiny metallic dot of a suitable modifier is initially joined by melting under ultrasonic agitation and subsequently heating the joined wafer and metal above the melting point of the metal for a relatively short duration.

More particularly, the present technique in accordance with a preferred embodiment of the invention provides fused junctions by adhering a metallic dot to a semiconductive material by heating the dot to a temperature approximately 30 degrees above the melting point of the particular metal or alloy and applying supersonic vibrations to form a metal-to-semiconductor bond. The ultrasonic vibrations set up cavitation in the molten metal which removes the surface film under conditions where no fresh oxide can reform and also without damage to the semiconductive surface. Significantly, the bonding is accomplished without any preliminary preparation or cleaning, even with surfaces that show badly corrosive conditions.

The technique comprises three basic steps for forming p-n junctions: First, the metal or alloy in the form of a tiny dot about 3 mil in diameter is placed in contact with the wafer without surface preparation, and the dot is heated with a soldering iron sufficient to melt the dot. Ultrasonic vibrations are then applied to the melt with the iron for a short duration in the frequency range of about 5,000 to 70,000 c.p.s. A bond between metal and semiconductor is achieved without surface preparation, fluxing, tinning or any subsequent washing. Once this bond has formed, the adherence of the dot to the wafer shields the interface and obviates further need for any special atmosphere in forming the alloy.

A soldering iron operating at frequencies of about 20 to 40 kc. with a 10-watt power unit has been found to be effective in bonding the metal to the wafer. The essential requirement is a vibrator capable of producing violent cavitation in the molten dot. The duration to which the parts are subjected to ultrasonic vibration is not important. It is essential only to provide ultrasonic vibration for a time sufficient to clear the surface film in order to form an adhering bond.

Next, the joined parts are heated to a temperature and for a time sufficient to alloy the metal and wafer. An inert atmosphere is not necessary for the alloying step, for the initial bond is free from surface impurities and contamination does not occur. The alloying step is obtained by heating the bonded parts to a temperature of about 550° C. for about 15 to 25 seconds in a precisely controlled furnace maintained at 900° C. The high furnace temperature provides the high thermal mass which appears to be effective for the rapid fusion of the metal.

Finally, the alloyed parts are removed from the heated zone and immediately quenched with water. The alloyed semiconductor and metal atoms are thus regrown into the crystal to produce metal-saturated p or n type region in the crystal specimen.

Ultrasonic soldering was previously employed in connection with tinning of metal electrodes prior to soldering them on semiconductor surfaces to form ohmic or rectifying contacts. However, the semiconductors required surface treatment, mentioned earlier, and the tinned electrodes were soldered in an inert atmosphere.

P-n junctions were formed in accordance with the present process in alloying a 3 mil dot of an alloy consisting of indium and containing 0.5% Ga and 0.5% Zn. The alloy dot was positioned on a monocrystalline germanium wafer which was 1.5 mm. square and 0.15 mm. thick. The bulk of the germanium specimen had a resistivity of about $10^{-3}$ ohms-centimeter and was doped with arsenic with an average concentration of about $5\times10^{19}$ atoms of arsenic per cubic centimeters. The dot was melted with a supersonic soldering iron operating at frequencies of about 40 kc. and with a 10-watt power unit. The bonded metal formed a relatively large bonding area on the wafer. The assembled parts were then brought to a temperature of about 550° C. in a precisely controlled furnace maintained at 900° C. The parts were held in the heated zone for about 20 seconds, and then they were immediately removed and quenched with water.

After the quenching step, the wafer was dried and ohmic connections were made in the usual manner. Peak current values obtained for these diodes averaged about 7 amperes and ranged from about 1 to 50 amperes. The peak-to-valley current ratios obtained were as high as 10 to 1.

It should be clear that the technique described herein is capable of fabricating p-n junctions for diodes generally. In particular, the technique has been found to be applicable to the more exacting requirements of tunnel diodes.

Various modifications are contemplated and may be resorted to by those skilled in the art without departing from the spirit and scope of the invention, as hereinafter defined by the appended claim, as only a preferred embodiment thereof has been disclosed.

What is claimed is:

The process of fabricating p-n junctions in diodes comprising the following steps:

Depositing a modifier dot on a semiconductor wafer,

Heating said dot sufficiently to form a melt thereof,

Applying ultrasonic vibration to said melt to form a bond between said dot and said wafer, Placing said bonded dot and wafer into a furnace heated at a temperature of about 900° C. for a time sufficient to heat said bonded parts to a temperature of about 550° C. for about 15–25 seconds and Quenching said parts in water whereby there is formed a transition region in said semiconductor wafer of about 100 to 200 Angstroms.

References Cited by the Examiner

UNITED STATES PATENTS

| | | | |
|---|---|---|---|
| 2,992,947 | 7/1961 | Gotzberger | 148—184 |
| 3,092,521 | 6/1963 | Pohl | 148—184 |
| 3,109,758 | 11/1963 | Bathdorf et al. | 148—185 |
| 3,110,849 | 11/1963 | Soltys | 148—185 |

BENJAMIN HENKIN, *Primary Examiner.*

HYLAND BIZOT, DAVID L. RECK, *Examiners.*